(12) United States Patent
Fox et al.

(10) Patent No.: US 9,251,873 B1
(45) Date of Patent: Feb. 2, 2016

(54) METHODS AND SYSTEMS FOR PIN-EFFICIENT MEMORY CONTROLLER INTERFACE USING VECTOR SIGNALING CODES FOR CHIP-TO-CHIP COMMUNICATIONS

(71) Applicant: Kandou Labs SA, Lausanne (CH)

(72) Inventors: John Fox, Lausanne (CH); Brian Holden, Monte Sereno, CA (US); Amin Shokrollahi, Preverenges (CH); Anant Singh, Pully (CH); Giuseppe Surace, Lausanne (CH)

(73) Assignee: KANDOU LABS, S.A. (CH)

( * ) Notice: Subject to any disclaimer, the term of this patent is extended or adjusted under 35 U.S.C. 154(b) by 0 days.

(21) Appl. No.: 14/108,316

(22) Filed: Dec. 16, 2013

Related U.S. Application Data

(60) Provisional application No. 61/738,329, filed on Dec. 17, 2012.

(51) Int. Cl.
*G11C 7/10* (2006.01)
*G11C 7/22* (2006.01)
*G06F 13/42* (2006.01)
*G06F 13/16* (2006.01)

(52) U.S. Cl.
CPC .......... *G11C 7/1072* (2013.01); *G06F 13/1689* (2013.01); *G06F 13/4243* (2013.01); *G11C 7/22* (2013.01)

(58) Field of Classification Search
CPC ... G06F 13/4243; G06F 13/1689; G11C 7/22; G11C 7/1072; G11C 7/1066
See application file for complete search history.

(56) References Cited

U.S. PATENT DOCUMENTS

| | | | |
|---|---|---|---|
| 3,636,463 | A | 1/1972 | Ongkiehong |
| 3,939,468 | A | 2/1976 | Mastin |
| 4,163,258 | A | 7/1979 | Ebihara et al. |
| 4,181,967 | A | 1/1980 | Nash et al. |
| 4,206,316 | A | 6/1980 | Burnsweig et al. |
| 4,486,739 | A | 12/1984 | Franaszek et al. |
| 4,499,550 | A | 2/1985 | Ray et al. |
| 4,864,303 | A | 9/1989 | Ofek |

(Continued)

FOREIGN PATENT DOCUMENTS

| | | |
|---|---|---|
| CN | 101478286 | 7/2009 |
| EP | 2039221 B1 | 3/2009 |

(Continued)

OTHER PUBLICATIONS

Abbasfar, A., "Generalized Differential Vector Signaling," IEEE International Conference on Communications, ICC '09, Jun. 14, 2009, pp. 1-5.

(Continued)

*Primary Examiner* — Farley Abad
(74) *Attorney, Agent, or Firm* — Invention Mine LLC

(57) ABSTRACT

Systems and methods are described for transmitting data over physical channels to provide a high speed, low latency interface such as between a memory controller and memory devices. Controller-side and memory-side embodiments of such channel interfaces are disclosed which require a low pin count and have low power utilization. In some embodiments of the invention, different voltage, current, etc. levels are used for signaling and more than two levels may be used, such as a vector signaling code wherein each wire signal may take on one of four signal values.

20 Claims, 6 Drawing Sheets

(56) References Cited

U.S. PATENT DOCUMENTS

| | | |
|---|---|---|
| 5,053,974 A | 10/1991 | Penz |
| 5,166,956 A | 11/1992 | Baltus et al. |
| 5,168,509 A | 12/1992 | Nakamura et al. |
| 5,283,761 A | 2/1994 | Gillingham |
| 5,412,689 A | 5/1995 | Chan et al. |
| 5,511,119 A | 4/1996 | Lechleider |
| 5,553,097 A | 9/1996 | Dagher |
| 5,599,550 A | 2/1997 | Kohlruss et al. |
| 5,659,353 A | 8/1997 | Kostreski et al. |
| 5,825,808 A | 10/1998 | Hershey et al. |
| 5,995,016 A | 11/1999 | Perino |
| 6,005,895 A | 12/1999 | Perino et al. |
| 6,084,883 A | 7/2000 | Norrell et al. |
| 6,172,634 B1 | 1/2001 | Leonowich et al. |
| 6,175,230 B1 | 1/2001 | Hamblin et al. |
| 6,278,740 B1 | 8/2001 | Nordyke |
| 6,359,931 B1 | 3/2002 | Perino et al. |
| 6,404,820 B1 | 6/2002 | Postol |
| 6,417,737 B1 | 7/2002 | Moloudi et al. |
| 6,452,420 B1 | 9/2002 | Wong |
| 6,504,875 B2 | 1/2003 | Perino et al. |
| 6,509,773 B2 | 1/2003 | Buchwald |
| 6,556,628 B1 | 4/2003 | Poulton et al. |
| 6,563,382 B1 | 5/2003 | Yang et al. |
| 6,621,427 B2 | 9/2003 | Greenstreet |
| 6,650,638 B1 | 11/2003 | Walker et al. |
| 6,661,355 B2 | 12/2003 | Cornelius et al. |
| 6,766,342 B2 | 7/2004 | Kechriotis |
| 6,839,429 B1 | 1/2005 | Gaikwad et al. |
| 6,954,492 B1 | 10/2005 | Williams |
| 6,990,138 B2 | 1/2006 | Bejjani et al. |
| 6,999,516 B1 | 2/2006 | Rajan |
| 7,053,802 B2 | 5/2006 | Cornelius |
| 7,085,153 B2 | 8/2006 | Ferrant et al. |
| 7,142,612 B2 | 11/2006 | Horowitz et al. |
| 7,167,019 B2 | 1/2007 | Broyde et al. |
| 7,180,949 B2 | 2/2007 | Kleveland et al. |
| 7,184,483 B2 | 2/2007 | Rajan |
| 7,356,213 B1 | 4/2008 | Cunningham et al. |
| 7,358,869 B1 | 4/2008 | Chiarulli et al. |
| 7,362,130 B2 | 4/2008 | Broyde et al. |
| 7,389,333 B2 | 6/2008 | Moore et al. |
| 7,633,850 B2 | 12/2009 | Ahn |
| 7,656,321 B2 | 2/2010 | Wang |
| 7,706,524 B2 | 4/2010 | Zerbe |
| 7,746,764 B2 | 6/2010 | Rawlins et al. |
| 7,787,572 B2 | 8/2010 | Scharf et al. |
| 7,882,413 B2 | 2/2011 | Chen et al. |
| 7,933,770 B2 | 4/2011 | Kruger et al. |
| 8,064,535 B2 | 11/2011 | Wiley |
| 8,091,006 B2 | 1/2012 | Prasad et al. |
| 8,159,375 B2 | 4/2012 | Abbasfar |
| 8,159,376 B2 | 4/2012 | Abbasfar |
| 8,279,094 B2 | 10/2012 | Abbasfar |
| 8,429,495 B2 | 4/2013 | Przybylski |
| 8,442,099 B1 | 5/2013 | Sederat |
| 8,442,210 B2 | 5/2013 | Zerbe |
| 8,443,223 B2 | 5/2013 | Abbasfar |
| 8,462,891 B2 | 6/2013 | Kizer et al. |
| 8,520,493 B2 | 8/2013 | Goulahsen |
| 8,547,272 B2 | 10/2013 | Nestler et al. |
| 8,588,280 B2 | 11/2013 | Oh et al. |
| 8,593,305 B1 | 11/2013 | Tajalli et al. |
| 8,649,445 B2 | 2/2014 | Cronie |
| 8,649,460 B2 | 2/2014 | Ware et al. |
| 8,718,184 B1 | 5/2014 | Cronie |
| 8,782,578 B2 | 7/2014 | Tell |
| 8,989,317 B1 | 3/2015 | Holden |
| 2001/0055344 A1 | 12/2001 | Lee et al. |
| 2002/0034191 A1 | 3/2002 | Shattil |
| 2002/0057592 A1 | 5/2002 | Robb |
| 2003/0071745 A1 | 4/2003 | Greenstreet |
| 2003/0105908 A1 | 6/2003 | Perino et al. |
| 2003/0227841 A1 | 12/2003 | Tateishi et al. |
| 2004/0057525 A1 | 3/2004 | Rajan et al. |
| 2004/0086059 A1 | 5/2004 | Eroz et al. |
| 2005/0135182 A1 | 6/2005 | Perino et al. |
| 2005/0152385 A1 | 7/2005 | Cioffi |
| 2005/0174841 A1 | 8/2005 | Ho |
| 2005/0286643 A1 | 12/2005 | Ozawa et al. |
| 2006/0159005 A1 | 7/2006 | Rawlins et al. |
| 2007/0260965 A1 | 11/2007 | Schmidt et al. |
| 2007/0263711 A1 | 11/2007 | Kramer et al. |
| 2007/0283210 A1 | 12/2007 | Prasad et al. |
| 2008/0104374 A1 | 5/2008 | Mohamed |
| 2008/0159448 A1 | 7/2008 | Anim-Appiah et al. |
| 2008/0273623 A1 | 11/2008 | Chung et al. |
| 2009/0059782 A1 | 3/2009 | Cole |
| 2009/0092196 A1 | 4/2009 | Okunev |
| 2009/0132758 A1 | 5/2009 | Jiang |
| 2009/0154500 A1 | 6/2009 | Diab et al. |
| 2009/0185636 A1 | 7/2009 | Palotai et al. |
| 2009/0212861 A1 | 8/2009 | Lim et al. |
| 2009/0228767 A1 | 9/2009 | Oh et al. |
| 2009/0257542 A1 | 10/2009 | Evans et al. |
| 2010/0104047 A1 | 4/2010 | Chen et al. |
| 2010/0180143 A1 | 7/2010 | Ware et al. |
| 2010/0205506 A1 | 8/2010 | Hara |
| 2010/0296550 A1 | 11/2010 | Abou Rjeily |
| 2011/0051854 A1 | 3/2011 | Kizer et al. |
| 2011/0084737 A1 | 4/2011 | Oh et al. |
| 2011/0127990 A1 | 6/2011 | Wilson et al. |
| 2011/0235501 A1 | 9/2011 | Goulahsen |
| 2011/0268225 A1 | 11/2011 | Cronie et al. |
| 2011/0299555 A1 | 12/2011 | Cronie et al. |
| 2011/0302478 A1 | 12/2011 | Cronie et al. |
| 2011/0317559 A1 | 12/2011 | Kern et al. |
| 2012/0063291 A1 | 3/2012 | Hsueh et al. |
| 2012/0213299 A1 | 8/2012 | Cronie et al. |
| 2013/0010892 A1 | 1/2013 | Cronie et al. |
| 2013/0051162 A1 | 2/2013 | Amirkhany et al. |
| 2014/0254730 A1 | 9/2014 | Kim et al. |
| 2015/0078479 A1 | 3/2015 | Whitby-Stevens |

FOREIGN PATENT DOCUMENTS

| | | |
|---|---|---|
| JP | 2003163612 | 6/2003 |
| WO | 2009084121 | 7/2009 |
| WO | 2010031824 | 3/2010 |
| WO | 2011119359 | 9/2011 |

OTHER PUBLICATIONS

Dasilva, et al. "Multicarrier Orthogonal CDMA Signals for Quasi-Synchronous Communication Systems," IEEE Journal on Selected Areas in Communications, Jun. 1, 1994, vol. 12, No. 5, pp. 842-852.

Slepian, D., "Permutation Modulation", Proceedings of the Institute of Electrical Engineers, Institution of Electrical Engineers. Stevenage, GB, Mar. 1, 1965, vol. 53, No. 3, pp. 228-236.

Stan, M. et al., "Bus-Invert Coding for Low-power I/O", 1995, IEEE Transactions on VLSI systems, vol. 3, No. 1, pp. 49-50.

Tallini, L., et al. Transmission Time Analysis for the Parallel Asynchronous Communication Scheme:, 2003, IEEE Transactions on Computers, vol. 52, No. 5, pp. 558-571.

Wang, X. et al., "Applying CDMA Technique to Network-on-chip," IEEE Transactions on Very Large Scale Integration (VLSI) Systems, Oct. 1, 2007, vol. 15, No. 10, pp. 1091-1100.

International Search Report mailed Nov. 5, 2012, in International Patent Application S.N. PCT/EP2012/052767.

International Search Report mailed Jul. 14, 2011 in International Patent Application S.N. PCT/EP2011/002170.

Healey, A., et al., "A Comparison of 25 Gbps NRZ & PAM-4 Modulation used in Legacy & Premium Backplane Channels", DesignCon 2012, 16 pages.

International Search Report for PCT/US2014/053563, dated Nov. 11, 2014, 2 pages.

Clayton, P., "Introduction to Electromagnetic Compatibility", Wiley-Interscience, 2006.

She et al., "A Framework of Cross-Layer Superposition Coded Multicast for Robust IPTV Services over WiMAX," IEEE Commu-

(56) References Cited

OTHER PUBLICATIONS nications Society subject matter experts for publication in the WCNC 2008 proceedings, Mar. 31, 2008-Apr. 3, 2008, pp. 3139-3144.
Poulton, et al., "Multiwire Differential Signaling", UNC-CH Department of Computer Science Version 1.1, Aug. 6, 2003.
Skliar et al., A Method for the Analysis of Signals: the Square-Wave Method, Mar. 2008, Revista de Matematica: Teoria y Aplicationes, pp. 09-129.
International Search Report and Written Opinion from PCT/US2014/034220 mailed Aug. 21, 2014.
International Search Report and Written Opinion for PCT/US14/052986 mailed Nov. 24, 2014.
Burr, "Spherical Codes for M-ARY Code Shift Keying", University of York, Apr. 2, 1989, pp. 67-72, United Kingdom.
Stan, M., et al., "Bus-Invert Coding for Low-Power I/O, IEEE Transactions on Very Large Scale Integration (VLSI) Systems", vol. 3, No. 1, Mar. 1995, pp. 49-58.
Tallani, L, et al., "Transmission Time Analysis for the Parallel Asynchronous Communication Scheme", IEEE Tranactions on Computers, vol. 52, No. 5, May 2003, pp. 558-571.
International Search Report and Written Opinion for PCT/EP2012/052767 mailed May 11, 2012.
International Search Report and Written Opinion for PCT/EP2011/059279 mailed Sep. 22, 2011.
International Search Report and Written Opinion for PCT/EP2011/074219 mailed Jul. 4, 2012.
Notification of Transmittal of the International Search Report and the Written Opinion of the International Searching Authority, or The Declaration for PCT/EP2013/002681, dated Feb. 25, 2014, 15 pages.
Ericson, T., et al., "Spherical Codes Generated by Binary Partitions of Symmetric Pointsets", IEEE Transactions on Information Theory, vol. 41, No. 1, Jan. 1995, pp. 107-129.
Farzan, K., et al., "Coding Schemes for Chip-to-Chip Interconnect Applications", IEEE Transactions on Very Large Scale Integration (VLSI) Systems, vol. 14, No. 4, Apr. 2006, pp. 393-406.
Cheng, W., "Memory Bus Encoding for Low Power: A Tutorial", Quality Electronic Design, IEEE, International Symposium on Mar. 26-28, 2001, pp. 199-204, Piscataway, NJ.
Brown, L., et al., "V.92: The Last Dial-Up Modem?", IEEE Transactions on Communications, IEEE Service Center, Piscataway, NJ., USA, vol. 52, No. 1, Jan. 1, 2004, pp. 54-61. XP011106836, ISSN: 0090-6779, DOI: 10.1109/tcomm.2003.822168, pp. 55-59.

Notification of Transmittal of International Search Report and the Written Opinion of the International Searching Authority, for PCT/US2015/018363, mailed Jun. 18, 2015, 13 pages.
Counts, L, et al., "One-Chip Slide Rule Works with Logs, Antilogs for Real-Time Processing," Analog Devices Computational Products 6, Reprinted from Electronic Design, May 2, 1985, 7 pages.
Design Brief 208 Using the Anadigm Multiplier CAM, Copyright 2002 Anadigm, 6 pages.
Grahame, J., "Vintage Analog Computer Kits," posted on Aug. 25, 2006 in Classic Computing, 2 pages, http.//www.retrothing.com/2006/08/classic_analog_html.
Schneider, J., et al., "ELEC301 Project: Building an Analog Computer," Dec. 19, 1999, 8 pages, http://www.clear.rice.edu/elec301/Projects99/anlgcomp/.
Tierney, J., et al., "A digital frequency synthesizer," Audio and Electroacoustics, IEEE Transactions, Mar. 1971, pp. 48-57, vol. 19, Issue 1, 1 page Abstract from http://ieeexplore.
"Introduction to: Analog Computers and the DSPACE System," Course Material ECE 5230 Spring 2008, Utah State University, www.coursehero.com, 12 pages.
Notification of Transmittal of The International Search Report and The Written Opinion of the International Searching Authority, or the Declaration, for PCT/US2014/015840, dated May 20, 2014. 11 pages.
Notification of Transmittal of The International Search Report and The Written Opinion of the International Searching Authority, or the Declaration, for PCT/US2014/043965, dated Oct. 22, 2014, 10 pages.
Notification of Transmittal of The International Search Report and The Written Opinion of the International Searching Authority, or The Declaration, dated Mar. 3, 2015, for PCT/US2014/066893, 9 pages.
International Preliminary Report on Patentability for PCT/US2014/015840, dated Aug. 11, 2015, 7 pages.
Jiang, A., et al., "Rank Modulation for Flash Memories", IEEE Transactions of Information Theory, Jun. 2006, vol. 55, No. 6, pp. 2659-2673.
Zouhair Ben-Neticha et al, "The "streTched"-Golay and other codes for high-SNR finite-delay quantization of the Gaussian source at 1/2 Bit per sample", IEEE Transactions on Communications, vol. 38, No. 12 Dec. 1, 1990, pp. 2089-2093, XP000203339, ISSN: 0090-6678, DOI: 10.1109/26.64647.
Oh, et al., Pseudo-Differential Vector Signaling for Noise Reduction in Single-Ended Signaling, DesignCon 2009.

| Tribit | Names | Line code (W3,W2,W1,W0) | Special use |
|---|---|---|---|
| 0b000 | H0, H_START | 1/3, 1/3, 1/3, -1 | Packet start |
| 0b001 | H1 | 1/3, 1/3, -1, 1/3 | |
| 0b010 | H2 | 1/3, -1, 1/3, 1/3 | |
| 0b011 | H3 | -1, 1/3, 1/3, 1/3 | |
| 0b100 | H4 | -1/3, -1/3, -1/3, 1 | |
| 0b101 | H5 | -1/3, -1/3, 1, -1/3 | |
| 0b110 | H6 | -1/3, 1, -1/3, -1/3 | |
| 0b111 | H7, H_IDLE | 1, -1/3, -1/3, -1/3 | Idle |

Figure 6

METHODS AND SYSTEMS FOR PIN-EFFICIENT MEMORY CONTROLLER INTERFACE USING VECTOR SIGNALING CODES FOR CHIP-TO-CHIP COMMUNICATIONS

CROSS REFERENCES

This application claims priority under 35 USC Sec. 119 to U.S. Provisional Application No. 61/738,329, filed Dec. 17, 2012, entitled "Methods And Systems For Pin-Efficient Memory Controller Interface Using Vector Signaling Codes For Chip-To-Chip Communication," the contents of which are hereby incorporated herein by reference.

The following references are herein incorporated by reference in their entirety for all purposes:

U.S. Patent Publication 2011/0268225 of U.S. patent application Ser. No. 12/784,414, filed May 20, 2010, naming Harm Cronie and Amin Shokrollahi, entitled "Orthogonal Differential Vector Signaling" (hereinafter "Cronie I");

U.S. Patent Publication 2011/0302478 of U.S. patent application Ser. No. 12/982,777, filed Dec. 30, 2010, naming Harm Cronie and Amin Shokrollahi, entitled "Power and Pin Efficient Chip-to-Chip Communications with Common-Mode Resilience and SSO Resilience" (hereinafter "Cronie II");

U.S. patent application Ser. No. 13/030,027, filed Feb. 17, 2011, naming Harm Cronie, Amin Shokrollahi and Armin Tajalli, entitled "Methods and Systems for Noise Resilient, Pin-Efficient and Low Power Communications with Sparse Signaling Codes" (hereinafter "Cronie III"); and U.S. patent application Ser. No. 13/463,742, filed May 3, 2012, naming Harm Cronie and Amin Shokrollahi, entitled "Finite State Encoders and Decoders for Vector Signaling Codes" (hereafter called "Cronie IV").

U.S. patent application Ser. No. 13/603,107, filed Sep. 9, 2012, naming Brian Holden and Amin Shokrollahi, entitled "Methods and Systems for Selection of Unions of Vector Signaling Codes for Power and Pin Efficient Chip-To-Chip Communication" (hereinafter called "Holden I").

U.S. patent application Ser. No. 13/671,426, filed Nov. 7, 2012, naming Brian Holden and Amin Shokrollahi, entitled "Crossbar Switch Decoder for Vector Signaling Codes" (hereinafter called "Holden II").

BACKGROUND

In communication systems, information may be transmitted from one physical location to another. Furthermore, it is typically desirable that the transport of this information is reliable, is fast and consumes a minimal amount of resources. One of the most common information transfer mediums is the serial communications link, which may be based on a single wire circuit relative to ground or other common reference, multiple such circuits relative to ground or other common reference, or multiple circuits used in relation to each other. An example of the latter utilizes differential signaling (DS). Differential signaling operates by sending a signal on one wire and the opposite of that signal on a paired wire; the signal information is represented by the difference between the wires rather than their absolute values relative to ground or other fixed reference.

Differential signaling enhances the recoverability of the original signal at the receiver, over single ended signaling (SES), by cancelling crosstalk and other common-mode noise, but a side benefit of the technique is that the Simultaneous Switching Noise (SSN) transients generated by the two signals together is nearly zero; if both outputs are presented with an identical load, the transmit demand on its power supply will be constant, regardless of the data being sent. Any induced currents produced by terminating the differential lines in the receiver will similarly cancel out, minimizing noise induction into the receiving system.

There are a number of signaling methods that maintain the desirable properties of DS while increasing pin-efficiency over DS. Many of these attempts operate on more than two wires simultaneously, using binary signals on each wire, but mapping information in groups of bits.

Vector signaling is a method of signaling. With vector signaling, pluralities of signals on a plurality of wires are considered collectively although each of the plurality of signals may be independent. Each of the collective signals is referred to as a component and the number of plurality of wires is referred to as the "dimension" of the vector. In some embodiments, the signal on one wire is entirely dependent on the signal on another wire, as is the case with DS pairs, so in some cases the dimension of the vector may refer to the number of degrees of freedom of signals on the plurality of wires instead of the number of wires in the plurality of wires.

With binary vector signaling, each component takes on a coordinate value (or "coordinate", for short) that is one of two possible values. As an example, eight SES wires may be considered collectively, with each component/wire taking on one of two values each signal period. A "code word" of this binary vector signaling is one of the possible states of that collective set of components/wires. A "vector signaling code" or "vector signaling vector set" is the collection of valid possible code words for a given vector signaling encoding scheme. A "binary vector signaling code" refers to a mapping and/or set of rules to map information bits to binary vectors.

With non-binary vector signaling, each component has a coordinate value that is a selection from a set of more than two possible values. A "non-binary vector signaling code" refers to a mapping and/or set of rules to map information bits to non-binary vectors.

Examples of vector signaling methods are described in Cronie I, Cronie II, Cronie III, and Cronie IV.

BRIEF SUMMARY

In accordance with at least one embodiment of the invention, processes and apparatuses provide for transmitting data over physical channels to provide a high speed, low latency interface such as between a memory controller and memory devices, requiring low pin count and providing low power utilization. Controller-side and memory-side embodiments of such channel interfaces are disclosed. In some embodiments of the invention, different voltage, current, etc. levels are used for signaling and more than two levels may be used, such as a ternary vector signaling code wherein each wire signal has one of three values.

This Brief Summary is provided to introduce a selection of concepts in a simplified form that are further described below in the Detailed Description. This Brief Summary is not intended to identify key or essential features of the claimed subject matter, nor is it intended to be used as an aid in determining the scope of the claimed subject matter. Other objects and/or advantages of the present invention will be apparent to one of ordinary skill in the art upon review of the Detailed Description and the included drawings.

BRIEF DESCRIPTION OF THE DRAWINGS

Various embodiments in accordance with the present disclosure will be described with reference to the drawings.

Same numbers are used throughout the disclosure and figures to reference like components and features.

FIG. 6 describes a use of the Kandou H4 Line Code as part of a communications protocol in accordance with at least one embodiment of the invention.

DETAILED DESCRIPTION

Specialized memory subsystems of modern computer systems utilize dedicated memory controllers to manage access, optimize performance, and improve utilization and reliability. Interconnections between these memory controllers and memory devices must operate at high speeds, delivering reliable and low latency data transfers, while under significant constraints in terms of available pin count and power utilization. Moreover, the design for interfaces to such interconnections is further constrained by implementation requirements, as controller devices are typically implemented using high speed logic processes, while memory devices such as DRAM rely on specialized processes optimized for high storage density and low leakage, but possibly not for fast logic speed. Thus, a successful memory-to-controller interconnection architecture must support implementation in multiple semiconductor processes.

In accordance with at least one embodiment of the invention, this disclosure describes a PHY (Physical Layer interface) and a Link Layer interface for both the controller and memory sides of such an interconnection, without presumption of limitation to the single embodiment provided as a descriptive example. Similarly, a packet format for communication of addressing, data transfer, and control operations using such an interconnection and interfaces is described, as one descriptive use example of a low-latency, pin- and power-efficient embodiment of the invention.

For purposes of description, this document uses the name "Bee" to describe this controller-to-memory interconnection system and/or a device embodying an interface for such interconnection. Without loss of generality, the physical interface between memory controller and memory device is herein described as utilizing point-to-point wire connections between integrated circuit devices, optionally including multidrop bussed interconnection of multiple memory devices and a single controller. Other embodiments of the invention may utilize other physical interfaces, including optical, inductive, capacitive, or electrical interconnection, and/or having more complex connection topologies.

Figure 1:
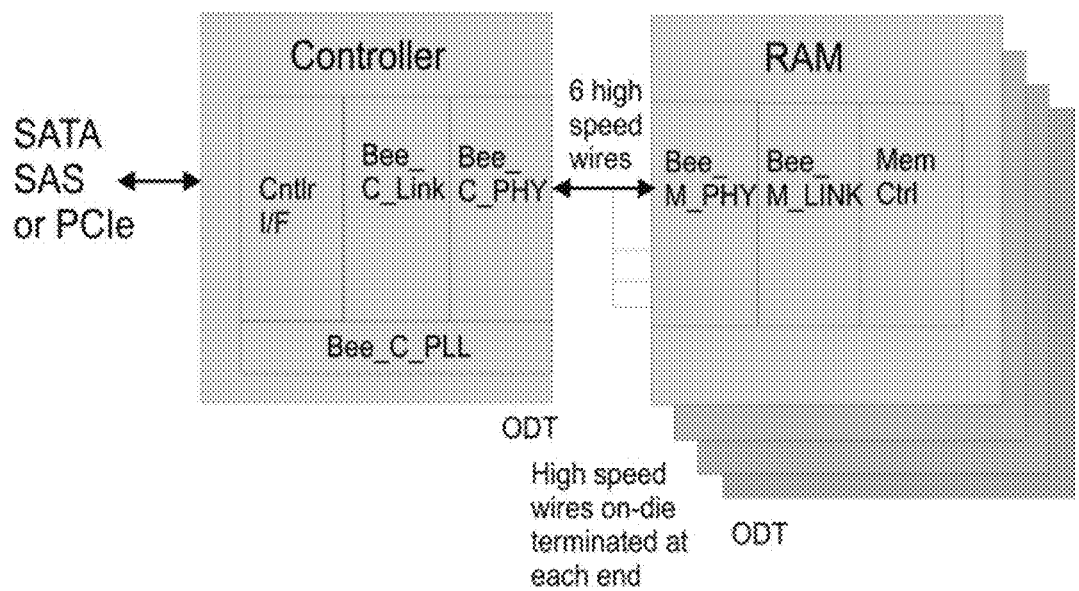
FIG. 1 is a block diagram of an example system comprised of a controller, host interface, memory interface, and memory, in accordance with at least one embodiment of the invention.
Figure 2:
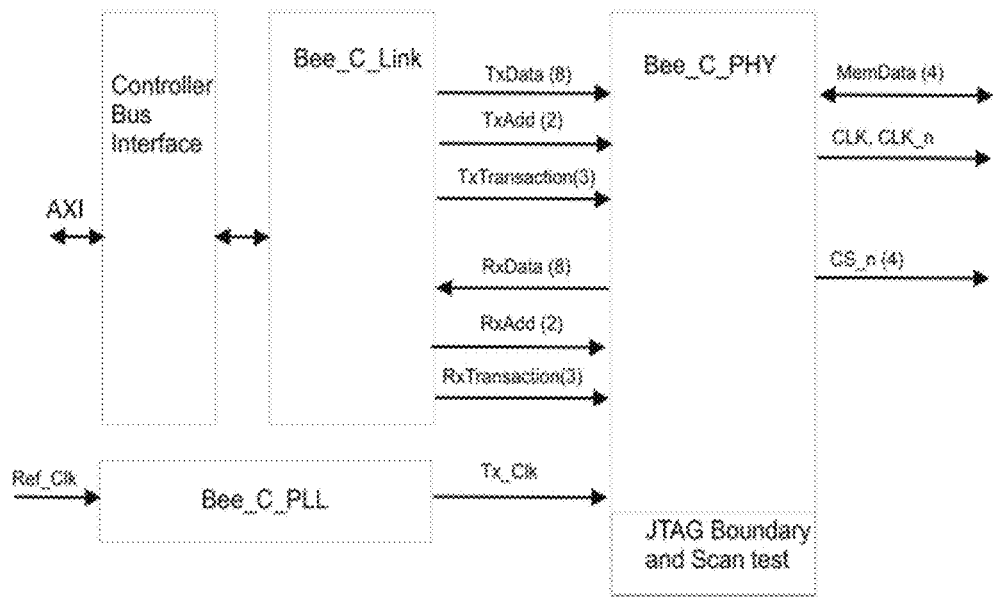
FIG. 2 is a block diagram detailing the controller side of the controller-to-memory interface, in accordance with at least one embodiment of the invention.

FIG. 2 is a block diagram detailing the controller side of the controller-to-memory interface, in accordance with at least one embodiment of the invention.

The Bee Controller side is composed of the Bee_C_Link link layer interface and the Bee_C_PHY physical layer interface. FIG. 2 is a block diagram detailing the controller side of the controller-to-memory interface, in accordance with at least one embodiment of the invention.

The Bee_C_PHY Hard IP packet physical layer interface is implemented in a 60 nm (or so) process and is a low power ensemble coded interface that can deliver 1.5 GB/s in each direction throughput over six high-speed physical wires: four bidirectional data wires and two clock wires. It is optimized for low power. In one embodiment, the interface is a four-wire H4 ensemble mode delivering a 3b4w interface, including six high speed wires total including a differential clock. The interface uses 33% transmitted line power as compared to differential signaling scheme and operates at 4 Gbaud/sec symbol rate, and providing either 1 GB/s or 1.5 GB/s throughput in each direction. In some embodiments, the interface has 3.6 mw/Gbps (43.6 mw) worst case power dissipation (12 Gb/s), and is configured to have 0.50 mm square footprint for interface elements in integrated circuit design. The device interfaces to 1-4 memory devices and connects to the link layer interface (Bee_C_LINK). It may be configured with a 24 bit parallel interface from Bee_C_LINK to PHY and use Command and Address multiplexing implemented in Bee_C_LINK.

In some embodiments, the Package and Channel either does not use equalization or utilizes simple equalization. In general, no skew tolerance circuits required, and a 50 mm FR4 trace maximum channel length may be used. Some embodiments utilize in-package MCM. The interfaces are wire-bond compatible, and may have a tileable layout to allow additional memory interfaces to be implemented on the controller. The pin-out may be chosen to minimize EMI.

In some embodiments, the transmitter sends a half rate clock at either 1.33 GHz or 2 GHz, and data is sent to be aligned to center of rising clock edge, thus no clock and data recovery (CDR) circuit is needed in the RAM. The transmitter slew rate is controlled. The device accepts transaction start and end interface signals from Bee_C_LINK and the device selection may also be input from Bee_C_LINK. In some embodiments, there is a Gearbox selector from the 24 bit system interface to the 3 bit encoder input. The transmitter also encodes a 3-bit input plus start input into a H4 symbol. The transmitter may drive four single ended chip select signals at half speed, and is configured in some embodiments to drive the H_IDLE H4 symbol before the chip select is asserted and then the H_START H4 symbol after the chip select is asserted.

The receiver may be configured with on-die channel termination, and the application of the termination may be determined by the statically wired external pin. In some embodiments, the Bee_C_LINK delivers the receive transaction timing to the PHY, and the Bee_C_LINK delivers the device selection. Further, the decoder may be configured to transform H4 symbols into tri-bits plus the start symbol. The Gearbox transforms the tri-bits plus the start and end packet indications into a 24-bit interface to Bee_C_LINK. Some embodiments may include a Phase aligner aligned via a boot-time routine. The receiver may have low power consumption when all input wires are at the common mode.

Power Management functions may include (i) power-down by removal of power from entire memory device; (ii) power-up transition is not very fast (milliseconds); (iii) standby-Active transitions controlled by input from the controller; and/or (v) additional moderate power standby mode.

Manufacturing aspects may include (i) marginable manufacturing loopback BERT test that is useful in-system between Bee devices; (ii) JTAG 1149.6 boundary and internal scan; (iii) 1 KV HBM and 250 V CDM ESD tolerance; and/or (iv) capable of being fully characterized & extended life tested post-silicon.

Figure 3:
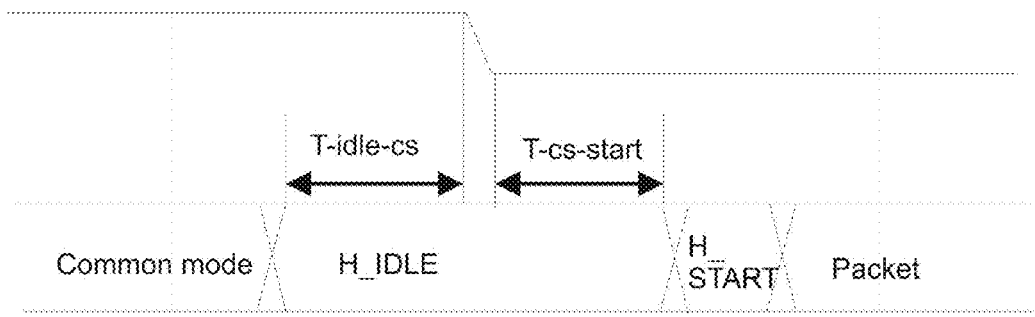
FIG. 3 is a timing diagram for the controller-to-memory interface packet start timing from the aspect of the memory controller, in accordance with at least one embodiment of the invention.

FIG. 3 is a timing diagram for the controller-to-memory interface packet start timing from the aspect of the memory controller, in accordance with at least one embodiment of the invention.

The Bee_C_PLL Hard IP packet physical layer interface is implemented in a 60 nm (or so) process. It is optimized for low power. The phase locked loop (PLL) may be configured as a 22 mw shareable PLL with 100 MHz input and 2 GHz multi-phase output. In some embodiments the PLL may be shared amongst multiple interfaces and/or may be integrated with other device functions.

The Bee_C_Link Hard IP physical layer interface is implemented in a 60 nm (or so) process that multiplexes and times the data for the Bee_C_PHY. It is optimized for low power. It may be configured to connect to a RAM controller containing an AXI bus controller. It also connects to the Bee_C_PHY.

System-side Transmit accepts full memory transactions from the memory controller and formats those transactions into Kandou Memory Link (KML) packets. The interface is configured to interoperate with at least a subset of the OFNI command set to operate the bi-directional request-response data bus. It may be configured to postpends a link CRC, and also to drive those packets into a FIFO along with the start and end of packet information. The interface may manage the Tx FIFO occupancy by pessimistically back-pressuring the bus interface taking into account the input from the receive side. In some embodiments, the interface implements a link layer retry protocol, at the cost of increased latency.

The PHY-side transmit includes a 24 bit interface out of the FIFO to the Bee_C_PHY, and also drives the start and end of packet timing into the gearbox in the Bee_C_PHY.

The PHY-side receive circuit provides the timing windows for the Bee_C_PHY to look for the H_START packet indication, and also provides the Bee_C_PHY and end of packet signal derived from the P_Length field. The receive circuit also accepts a 24 bit input from the interface from Bee_C_PHY and drives it into the FIFO. It may be configured to use cut-thru operations for low latency. The receiver may also check the link CRC and writes the results into the FIFO.

The system-side receive circuit may be configured to manage the Rx FIFO occupancy by pessimistically back-pressuring the Tx side bus interface taking into account both the Rx-FIFO needs of incoming transactions and the existing Rx-FIFO occupancy. It may also be configured to perform response matching of returned packets and handling link layer packets via a non-FIFO path. The receiver circuit also formats the KML responses back into memory transactions suitable for input to the AXI bus controller. In some embodiments, it may also implement a link layer retry protocol, at the cost of latency.

Figure 4:
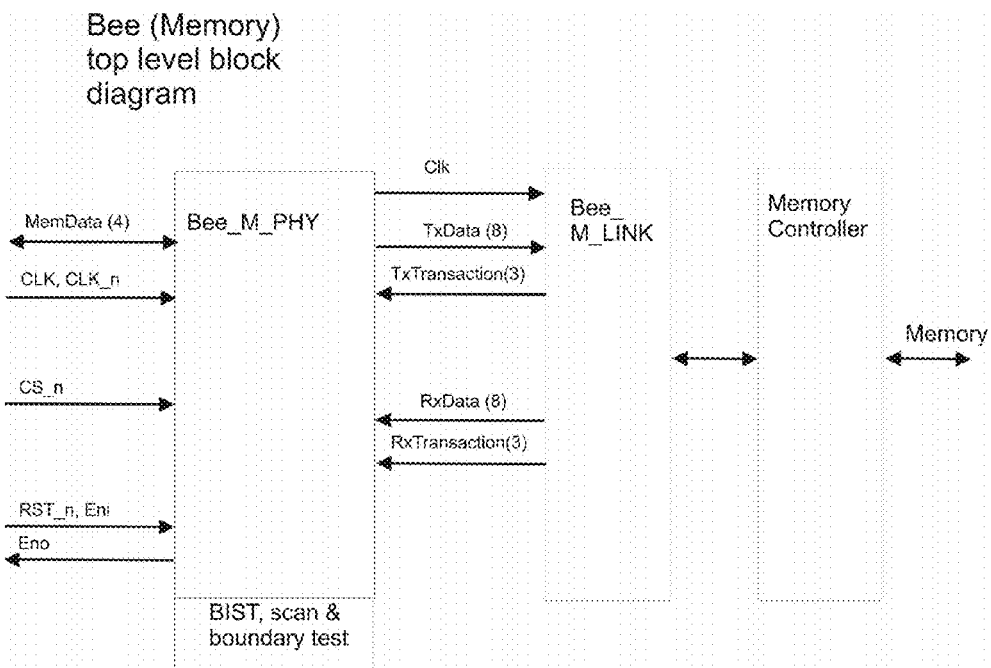
FIG. 4 is a block diagram detailing the memory side of the controller-to-memory interface, in accordance with at least one embodiment of the invention.

The Bee RAM side comprises the Bee_M_PHY physical layer interface and the Bee_M_Link.link layer interface. FIG. 4 is a block diagram detailing the memory side of this controller-to-memory system, in accordance with at least one embodiment of the invention.

The matching Bee_M_PHY Hard IP (RAM Side) packet physical layer interface is implemented in a DRAM-optimized process that is equivalent to a 100 to 130 nm CMOS process (1 to 1.2 V Vdd), is low power, and uses one of Kandou's vector signaling codes. It is optimized for low power. The differences from the controller-side interface include the following.

Some embodiments may include an additional processor interface accessible from the link. It may be configured to connect to link layer IP (Bee_M_LINK). It may be configured to consume 6.4 mw/Gbps (76.9 mw) worst case power dissipation (12 Gb/s), and be implemented with a 0.95 mm square of implementation footprint for interface elements in DRAM integrated circuit design. The transmitter sends data on each rising edge of the received clock, and the transmitter slew rate is controlled. Multi-drop support is provided via the combination of the chip select assertion and the enumeration. The H_IDLE signal line is driven within a fixed interval after chip select assertion qualified with the enumeration, while the H_START signal line is driven within a fixed interval after the H_IDLE signal line is driven. The Bee_M_LINK delivers a 24 bit interface to the PHY and provides transaction timing to PHY. In some embodiments, it is configured in accordance with a 4:1 parallel implementation.

The Receiver is configured with on-die termination, and a statically wired external pin determines whether termination is applied. In some embodiments, no PLL or CDR is required, as it is configured with DDR forwarded differential clock. When the chip select is asserted, the PHY circuit is configured to finds the H_IDLE and H_START H4 symbols. The ecoder transforms H4 symbols into tri-bits plus the start symbol. In addition, the Gearbox transforms the tri-bits plus the start symbol into a 24-bit interface to Bee_M_LINK. The circuit is configured for low power consumption when all input wires are floating at the common mode, and may include a 1:4 parallel implementation.

Power management functions may include (i) power down by removal of power and/or (ii) fast resumption low power standby mode with the state of the wires controlled, rapid detection and indication of activity on the clock, and standby-active transitions via a state machine based on the clock activity.

Manufacturing aspects include (i) marginable manufacturing loopback BERT test that is useful in-system between Bee devices; (ii) JTAG 1149.6 boundary and internal scan; (iii) 1 KV HBM and 250 V CDM ESD tolerance; and (iv) fully characterized and extended life tested post-silicon.

Figure 5:
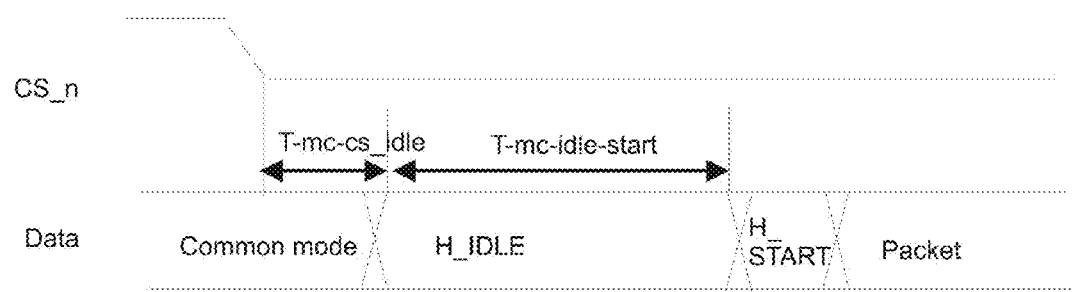
FIG. 5 is a timing diagram for the controller-to-memory packet start timing from the aspect of the memory device, in accordance with at least one embodiment of the invention.

FIG. 5 is a timing diagram for the controller-to-memory packet start timing from the aspect of the memory device, in accordance with at least one embodiment of the invention.

The Bee_M_Link Hard IP physical layer interface is, in some embodiments, implemented in a 60 nm process that multiplexes and times the data for the Bee_M_PHY. It is optimized for low power. The interface connects to the Bee_M_PHY and to the memory controller inside of the RAM.

The PHY-side receive circuit provides the timing windows for the Bee_M_PHY to look for the H_START packet indication and provides the Bee_M_PHY and end of packet signal derived from the P_Length field. It may be configured to accept a 24 bit input from the interface from Bee_M_PHY and drives it into the FIFO, and may use cut-thru operation for low latency. The receive circuit writes the results of the CRC calculation after the packet into the FIFO.

The memory-side receiver circuit manages the 24 bit wide Rx FIFO occupancy by pessimistically back-pressuring the Tx side bus interface taking into account Rx-FIFO needs of incoming transactions and the existing Rx-FIFO occupancy. The receiver also: (i) performs response matching of returned packets; (ii) handles link layer packets via a non-FIFO path; (iii) formats the KML responses back into bus transactions suitable for handling by the memory controller; and/or (iv) implements a link layer retry protocol, at the cost of increased latency.

The memory-side transmit circuit is configured to (i) accept full bus transactions from the memory controller; (ii) format those transactions into Kandou Memory Link (KML) packets; (iii) is compatible with the OFNI command set to operate the bi-directional request-response data bus; (iv) prepends a fixed link layer preamble; (v) postpends a link CRC; (vi) drives those packets into a 24 bit wide FIFO along with the start and end of packet information; (vii) manages the Tx FIFO occupancy by pessimistically back-pressuring the bus interface taking into account the input from the receive side; and in some embodiments implements a link layer retry protocol, at the cost of increased latency.

The PHY-side transmit circuit drives a 24 bit wide interface out of the FIFO to the Bee_M_PHY and drives the start and end of packet timing into the gearbox in the Bee_M_PHY.

The enumeration function automatically enumerates a daisy chain of memory devices using the ENi and ENo pins to extend the addressability of the chip selects as per the OFNI specification or an extension of that specification.

FIG. 6 describes a use of the Kandou H4 Line Code as part of a communications protocol in accordance with at least one embodiment of the invention. KH4C is a 3b4w (3 bits over 4 wires) code appropriate for narrow high performance interfaces. It is a balanced code of four symbols per codeword, one symbol taking on the value +1 or −1, with the remaining three symbols taking on the value −⅓ or +⅓, respectively.

Another embodiment of the invention supports a 3b5w (3-bits conveyed over 5 wires) code where each data value may be encoded as either of two equivalent codewords. Alternation of such equivalent codewords provides an effective return clock, making receipt of a sequence of such code words self-clocking Another embodiment provides two additional clock lines that a selected memory device uses to reflect its received clock back to the controller, similarly providing synchronization of symbols transmitted in the memory-to-controller direction.

The following is a description of the Kandou Memory Link (KML) protocol, in accordance with at least one embodiment of the invention. KML is a protocol appropriate for a high-speed, narrow interface to a memory device. It supports variable-size block write and block read operations at arbitrary start addresses, with data transfer integrity verified using a cyclic-redundancy check code. The protocol may also optionally support access to link-level command/information packets for use by additional control and monitoring applications.

The memory side send a response packet or a link layer packet.

In the memory to controller direction, a 1 symbol preamble is added: H_START.

In the controller to memory direction, a 1 symbol preamble is added: H_START.

Write Packets
P_Command—8 bits
P_SeqNum—4 bits (TBD—if retry)
P_Tag—4 bits
P_Address—32 bit
P_Length—8 bits
P_Data—8 to 2048 bits
P_CRC—8 to 32 bits Read Request Packets
P_Command—8 bits
P_SeqNum—4 bits (TBD—if retry)
P_Tag—4 bits
P_Address—32 bit
P_Length—8 bits
P_CRC—8 to 32 bits Response Packets
P_Command—8 bits
P_SeqNum—4 bits (TBD—if retry)
P_Tag—4 bits
P_Length—8 bits
P_Data—8 to 2048 bits
P_CRC—8 to 32 bits Link Layer Packets (for some embodiments)
P_Command—8 bits
P_Info—16 bits
P_CRC—8 to 32 bits In one embodiment, a collection of interconnection signal lines; a memory-controller interface circuit; a link layer signaling protocol control circuit; a physical layer signaling protocol control circuit that maps symbols of a vector signaling code to the collection of interconnection signal lines and provides timing information for symbol communication, wherein the link layer signaling protocol circuit provides bidirectional address and data transmission to the memory controller interface circuit. The collection of interconnection signal lines may take the form of four bidirectional data lines and two clock lines. In a further embodiment, the physical layer signaling protocol control circuit communicates three data bits over the four data lines using a balanced code of symbols having four distinct signal levels. The collection of interconnection signal lines may additionally comprise two clock lines carrying a return clock signal to the controller device. In yet a further embodiment, the collection of interconnection lines comprises five bidirectional data lines and two clock lines. In a further embodiment, the physical layer signaling protocol control circuit may communicate three data bits over five lines, and the link layer protocol circuit is self-clocking in the memory-to-controller direction.

In a further embodiment, a method comprises: transmitting messages from a memory controller using a vector signaling code, the messages selected from the group consisting of a memory write, a memory read, and a status interrogation command; receiving a response message in the form of one or more vector signaling codes, the response message selected from the group consisting of a memory write complete, a memory read result, a status response, and an error report message, wherein each transmitted message and received response message comprises a series of vector signaling code words, each code word communicated as symbols carried as physical signals on a set of lines, and wherein consecutive code words of each message is synchronized by a symbol clock also carried as physical signals on the set of lines. The memory write and memory read operations may be configured to access a contiguous block of memory of a specified size at a specified memory address. The set of lines in one embodiment comprises four bidirectional data lines and two unidirectional symbol clock lines. In a further embodiment, the vector signaling code communicates three binary bits on four lines using a balanced code of four levels. In other embodiments, the series of vector signaling words corresponding to the response message is self-clocking The self-clocking may be obtained by receipt of a physical clock signal at the memory controller. The self-clocking may be obtained by alternation of redundant code words of the vector signaling code representing the same data value.

What is claimed is:
1. A device comprising:
a link layer signaling protocol control circuit configured to receive a plurality of memory transaction signals from a bus controller and responsively generate link layer bits, at a link layer interface, representing the memory transaction signals as a message packet, wherein the message packet is selected from the group consisting of a memory write packet, a memo read packet and a status interrogation command packet; and, a physical layer signaling protocol control circuit connected to the link layer interface and configured to receive the link layer bits, select a set of data bits from the link layer bits, form a code word of a vector signaling code based on the selected set of data bits, the code word comprising a first set of symbols, map the first set of symbols of the code word to a collection of interconnection signal lines and synchronize symbol communication via symbol clock lines.

2. The device of claim 1, wherein the collection of interconnection signal lines comprises four bidirectional data lines and two symbol clock lines.

3. The device of claim 2, wherein the physical layer signaling protocol control circuit communicates three data bits over the four data lines using a balanced code of symbols having four distinct signal levels.

4. The device of claim 3, wherein the collection of interconnection signal lines additionally comprises two clock lines carrying a return clock signal to the physical layer signaling protocol control circuit.

5. The device of claim 1, wherein the collection of interconnection lines comprises five bidirectional data lines and two symbol clock lines.

6. The device of claim 5, wherein the physical layer signaling protocol control circuit communicates three data bits over five lines, and the link layer protocol circuit is self-clocking in a memory-to-controller direction.

7. The device of claim 1, wherein the vector signaling code is an H4 signaling code.

8. The device of claim 1, wherein the physical layer signaling protocol control circuit is further configured to receive consecutive sets of symbols representing a second message packet via the connection of interconnection signal lines, the second message packet selected from the group consisting of a memory write complete packet, a memory read result packet, a status response packet, and an error report message packet, and wherein the physical layer signaling protocol control circuit is configured to decode the consecutive sets of symbols into consecutive sets of data bits, and form a second set of link layer bits representing the second message packet; and, wherein the link layer signaling protocol control circuit is configured to generate a second set of memory transaction signals based on the second set of link layer bits, and provide the second set of memory transaction signals to the bus controller.

9. The device of claim 1, wherein the link layer signaling protocol control circuit is further configured to select a memory device from a plurality of memory devices as a destination for the code word.

10. The device of claim 1, wherein the link layer signaling protocol control circuit is further configured to provide transaction timing information to the physical layer signaling protocol control circuit.

11. The device of claim 1, wherein the link layer bits comprise 24 bits, and the physical layer signaling protocol control circuit is configured to select 3 data bits from the 24 link layer bits.

12. The device of claim 1, wherein the interconnection signal lines are selected from the group consisting of an optical interface, an inductive interface, a capacitive interface and an electrical interface.

13. The device of claim 1, further comprising a simple equalizer configured to equalize the interconnection signal lines.

14. A method comprising:
transmitting messages from a memory controller using a vector signaling code, the messages selected from the group consisting of a memory write, a memory read, and a status interrogation command,
receiving a response message in the form of one or more vector signaling codes, the response message selected from the group consisting of a memory write complete, a memory read result, a status response, and an error report message,
wherein each transmitted message and received response message comprises a series of vector signaling code words, each code word communicated as symbols on a set of lines, and wherein consecutive code words of each message are synchronized by a symbol clock on the set of lines.

15. The method of claim 14, wherein the memory write and memory read operations access a contiguous block of memory of a specified size at a specified memory address.

16. The method of claim 14, wherein the set of lines comprises four bidirectional data lines and two unidirectional symbol clock lines.

17. The method of claim 16, wherein the vector signaling code communicates three binary bits on four lines using a balanced code of four levels.

18. The method of claim 14, wherein the series of vector signaling words corresponding to the response message is self-clocking.

19. The method of claim 18, wherein the self-clocking is obtained by receipt of a physical clock signal at the memory controller.

20. The method of claim 18, wherein the self-clocking is obtained by alternation of redundant code words of the vector signaling code representing the same data value.

* * * * *